US005441770A

United States Patent [19]

Rychwalski et al.

[11] Patent Number: 5,441,770

[45] Date of Patent: Aug. 15, 1995

[54] CONDITIONING PROCESS FOR ELECTROLESS PLATING OF POLYETHERIMIDES

[75] Inventors: James E. Rychwalski, Medway; Paul J. Ciccolo, Ashland; Robert B. Currie, Berkley; Philip D. Knudsen, Northboro, all of Mass.

[73] Assignee: Shipley Company Inc., Marlborough, Mass.

[21] Appl. No.: 747,443

[22] Filed: Aug. 14, 1991

Related U.S. Application Data

[63] Continuation of Ser. No. 525,711, May 18, 1990, abandoned.

[51] Int. Cl.[6] .......... B05D 1/00

[52] U.S. Cl. .......... 427/306; 427/304; 427/305; 427/443.1

[58] Field of Search .......... 427/437, 443.1, 304, 427/305, 306

[56] References Cited

U.S. PATENT DOCUMENTS

| | | | |
|---|---|---|---|
| 3,011,920 | 12/1961 | Shipley | 106/1.26 |
| 3,361,589 | 1/1968 | Lindsey | 156/319 |
| 3,445,350 | 5/1969 | Klinger et al. | |
| 3,567,594 | 3/1971 | Wells | 428/626 |
| 3,574,070 | 4/1971 | Sahely | |
| 3,627,558 | 12/1971 | Roger | 427/437 |
| 3,689,303 | 9/1972 | Maguire et al. | |
| 3,770,528 | 11/1973 | Hermes | |
| 3,817,774 | 6/1974 | Kuzmik | 427/304 |
| 3,963,590 | 6/1976 | Deyrup | |
| 4,078,096 | 3/1978 | Redmond | 427/307 |
| 4,112,139 | 9/1978 | Shirk | 427/306 |
| 4,325,991 | 4/1982 | Donovan, III et al. | |
| 4,325,992 | 4/1982 | Donovan, III et al. | |
| 4,425,380 | 1/1984 | Nuzzi | 427/98 |
| 4,467,067 | 8/1984 | Valayil | 427/98 |
| 4,515,829 | 5/1985 | Deckert | 427/97 |
| 4,517,254 | 5/1985 | Grapentin | 427/307 |
| 4,552,626 | 11/1985 | Stevenson | |
| 4,563,217 | 1/1986 | Kikuchi | 427/437 |
| 4,594,311 | 6/1986 | Frisch et al. | |
| 4,668,532 | 5/1987 | Moisan | 427/304 |
| 4,775,449 | 10/1988 | Dumas et al. | |
| 4,832,799 | 5/1989 | Knudsen | 427/306 |
| 4,842,946 | 6/1989 | Foust | 427/304 |
| 4,857,143 | 8/1989 | Glenning et al. | |
| 4,873,136 | 10/1989 | Foust | 427/304 |
| 4,910,045 | 3/1990 | Giesecke | 427/305 |
| 4,929,422 | 5/1990 | Mahlkow | 427/306 |
| 4,959,121 | 9/1990 | Dumas | 427/306 |
| 4,999,251 | 3/1991 | Foust | 427/306 |
| 5,019,425 | 5/1991 | Romer | 427/304 |
| 5,032,427 | 7/1991 | Kukanskis | 427/306 |

FOREIGN PATENT DOCUMENTS

| | | | |
|---|---|---|---|
| 990593 | 6/1976 | Canada | 427/306 |
| 3328765 | 2/1985 | Germany | 427/305 |
| 3916172 | 11/1990 | Germany | 427/306 |
| 8910431 | 11/1989 | WIPO | 427/306 |

OTHER PUBLICATIONS

L. Mackenzie Miall "A New Dictionary of Chemistry" Interscience Publishing Inc. 1961. pp. 240, 244.

Mark et al "Encyclopedia of Polymer Science And Engineering" vol. 12, John Wiley & Sons, 1988 pp. 364, 365, 371.

*Primary Examiner*—Michael Lusignan
*Assistant Examiner*—V. Duang Dang
*Attorney, Agent, or Firm*—Robert L. Goldberg

[57] ABSTRACT

A process for promoting the adhesion of metal to thermoplastic substrates such as polyetherimides. The improvement comprises conditioning the substrate by treating with an inorganic hydroxide solution prior to subsequent steps of etching and deposition of a metal coating. Use of the conditioner promotes increased adhesion between the substrate and the metal without loss of flexural strength of the substrate throughout subsequent processing steps.

17 Claims, No Drawings

CONDITIONING PROCESS FOR ELECTROLESS PLATING OF POLYETHERIMIDES

This is a continuation of application Ser. No. 525,711 filed on May 18, 1990, abandoned.

BACKGROUND OF THE INVENTION

1. Introduction

This invention relates to an improved method of treating the surface of an organic polymer substrate prior to electroless deposition of a metal coating. The method is easy to use, represents a reduction in the number of pretreatment steps necessary prior to electroless deposition of a metal onto the substrate and provides improved adhesion between the substrate and metal deposit.

2. Discussion of Prior Art

Even though significant progress has been made in the art of plating metals on plastics, the adhesion between the coating and the plastic still leaves much to be desired. Poor adhesion between the plastic and the metal plate allows differential dimensional changes with temperature which may result in warping, blistering, and cracking of the metallized product. Consequently, strong adhesion between a plastic substrate and the plated metallic layer is essential for any application in which the product is subjected to significant temperature fluctuations.

Numerous methods are proposed in the prior art for depositing a metal coating over plastic. The method most commonly used involves steps including surface converting a plastic part with an oxidant such as a solution of alkaline permanganate or sulfuric acid containing a source of hexavalent chromium ions, deposition of a conductive, adherent metallic film by chemical reduction followed by electrodeposition of an intermediate layer, frequently copper, and finally a layer of a desired outer metal coating such as chromium, nickel, gold, solder, silver or zinc. Only moderate bond strength between a plastic substrate and metal coating is obtained by this method. Also relatively high temperatures are required for the surface converting step and careful control of the chromium ion concentration is necessary.

Plastics show a relatively poor affinity for metal and to promote a stronger bond between a plastic substrate and a metallic coating the prior art has frequently resorted to roughening the plastic surface to provide locking or keying between the surface and its coating. The surface of a molded plastic article normally is glossy and quite hydrophobic. Consequently, this surface is unreceptive to aqueous solutions used in electroless metal deposition. Since the sensitizing and activating solutions will not wet the surface, the metal ions are not adsorbed onto the surface and deposition of the metal cannot proceed.

Rendering the surface of the substrate hydrophilic by roughening has been common practice in plating plastic materials. Initially, this surface roughening was accomplished by some form of mechanical deglazing, such as scrubbing with an abrasive slurry, wet tumbling, dry rolling or abrasive (sand) blasting. These procedures generally lead to a composite having an adequate bond between substrate and coating, but due to relatively large visible irregularities on the plastic surface formed during the roughening operation, a thick metal coating must be applied to avoid surface defects and obtain a coating having a smooth, highly polished appearance. Mechanical deglazing of the surface has been found to be fairly effective, but is extremely costly in that many parts have to be finished by hand. Another disadvantage to mechanical etching is that it is hard to control and many problems are encountered when the surface abrasion is carried too far. Methods of mechanical roughening are not applicable to three-dimensional products or more particularly, printed circuit boards having through-holes. In any event, adhesion values above a few pounds per inch are only rarely obtainable.

Roughening has also been accomplished chemically using an acidic etch solution or a solvent for dissolving a portion of the plastic surface. Chemical deglazing or etching techniques usually require use of strong, acidic solutions such as sulfuric acid and chromate salts. The latter treatment was found to have the effect of activating bonding sites for subsequent electroless metal deposition. Chemical etching by an acid chromate oxidizing solution was then found to be more effective when the surface was pretreated with a strong caustic, such as sodium hydroxide, combined with immersion in a reducing solution containing hydrochloric acid after the etching.

Further improvements of bond adhesion included using a pretreatment emulsion as described in U.S. Pat. No. 3,574,070. The emulsion consisted of a non-solvent for the plastic and a solvent for the plastic which were emulsifiable.

U.S. Pat. No. 4,594,311 describes a process for restoring hydrophobicity to the exposed surface of an adhesion promoted resinous surface of a base material after a catalytic resistless image has been imposed thereon. The process involves exposure of the treated resinous surface to a solvent or solvent vapors in order to restore hydrophobicity to the surface.

Pretreatment of an ABS polymer substrate prior to electroless deposition of metal is described in a 1969 U.S. Pat. No. 3,445,350. The method relates to specific solvents which may be used with the specific ABS resins to achieve improved adhesion.

Further studies in the area of adhesion promotion of ABS resins, including platable grades, showed that even though bond strength was improved, organic pre-conditioning has been observed to have an adverse effect on surface appearance. It was observed that when an ABS resin is organically pre-conditioned there is incomplete drainage of the pre-conditioning solution from the articles when they are withdrawn from the tank. Such problems showed themselves as defects in the article surface after electroless plating.

Another attempt at improvement was made and disclosed in U.S. Pat. No. 3,689,303. This process for pretreatment added an additional step of contacting an ABS resin article with an oxidizing agent prior to the organic pre-conditioning step. The method involves an 8–10 step process for pretreating an ABS resinous substrate prior to electroless deposition of metal.

Another patent, U.S. Pat. No. 4,552,626 teaches a combined pretreatment step of deglazing and removal of filler by use of an acid bath for polyamides. This step is preferred over the use of an organic solvent bath to deglaze the substrate, which may result in gelling of the resin if the solvent is not dilute.

U.S. Pat. No. 3,963,590 describes a process for electroplating polyoxymethylene (polyacetal). The pretreatment process involves treatment with quinoline or gamma-butyrolactone prior to acid etching.

Use of such techniques may result in degradation of the molecules forming the surface of the substrate, and may decrease both tensile and impact strength of the substrate due to swelling and cracking of the entire substrate material. Several of the prior art solvents used for organic pre-conditioning are also not suitable because they are known to remove significant amounts of the resin or resin filler, thus having a direct effect on the integrity of line and space dimensions of the substrate during further processing. For example, excessive roughening of a plastic substrate can hinder subsequent processing steps such as metallization, electrodeposition of photoresist materials, imaging and etching. If imaging of a deposited photoresist is desired, roughness may prevent sharp line definition of the photoresist materials. Also, a subsequently applied metal film will be difficult to remove due to plating in deep crevices on the surface of the plastic substrate.

While such methods as described above increase adhesion, they are often not transferable to all substrates and particularly not to all grades of engineering thermoplastic substrates. Numerous prior art patents confirm the lack of transferability of pretreatment processes from one substrate to the next or to substrates containing various fillers.

U.S. Pat. No. 3,567,594 discloses a process for treating of plastic substrates with acid chromate etch followed by an HF treatment prior to metallization. The process was disclosed as being applicable to certain ethylene propylene copolymers and polypropylene and was represented as being utile for polyesters. Donovan III, et al., in U.S. Pat. Nos. 4,325,991 and 325,992, evaluated the process of U.S. Pat. No. 3,567,594 on a platable grade of propylene polymer and found it to be functional. However, when they applied the same precess to a mineral-filled polyester substrate, the procedure failed. This lead to their disclosed methods, in the above referenced patents, for electroless plating of polyester substrates including pretreatment steps of contacting the surface with a detergent and hydrolizer prior to conditioning with an alkaline solution and etching with an acid fluoride solution.

A process disclosed as being applicable to polyimide substrates is disclosed in U.S. Pat. No. 4,775,449. The disclosed process provides for improving adhesion of metal to a polyimide surface without physical modification or degradation of the surface structure. The process involves pretreatment of the polyimide surface with an adhesion promoting compound containing a nitrogen-oxygen moiety prior to plating.

U.S. patent application Ser. No. 07/416,535, filed Oct. 3, 1989 now U.S. Pat. No. 5,178,956, and subject to common assignment with the present invention (hereafter the "Copending Application"), discloses a pretreatment process for polyetherimide or polyamides substrates. The process uses an organic lactone conditioner immediately followed by an aqueous rinse step to promote adhesion.

When organic solvents are used as conditioners, the solvent acts to swell the surface of the substrate. This swelling, generally seen as a white film on the substrate, aids in subsequent processing prior to electroless plating but is detrimental if not entirely removed. Any residue remaining on the surface or in the pores will result in areas of low adhesion. Use of organic solvents requires operation in very narrow process windows for selection of temperature of the conditioner and dwell time in the conditioner. Operation outside of these narrow process windows may result in loss of flexural strength of the substrate.

At minimal immersion times in the organic lactone conditioner of the Copending Application, it was found that after subsequent processing of a polyetherimide substrate, Ultem TM 2312 (manufactured by General Electric Company), there was a loss of 12 to 20% of the initial flexural strength as measured by ASTM Method 790. However, this loss of flexural strength does not apply to all grades of Ultem TM resins. For example, Ultem TM 3452 exhibits no change in flexural properties after treatment by the process of the above referenced application.

Aqueous solutions of metal hydroxides have been used in the prior art to etch polyimide substrates. U.S. Pat. No. 4,857,143 discloses an etchant suitable for use with fully or partially cured polyimides. The etchant is a metal hydroxide solution in combination with a metal carbonate, metal sulfate or metal phosphate. Etchants are known to attack plastics and are therefore not suitable for use as conditioners. Conditioners work to alter the chemistry of the plastic surface without extensive roughening of the surface.

U.S. Pat. No. 3,770,528 discloses a method for treating polyimides during the manufacture of composite laminated articles. The treatment consists essentially in subjecting the surface of a thin film of polyimide material to a solution, substantially anhydrous, of an alkali metal hydroxide in a high boiling glycol. After treatment of the film in the alkaline glycol solution, the film is rinsed with water, dried and laminated to a thin film of copper foil using a commercial adhesive. The laminates are then cured prior to testing. Example 1 in the '528 patent shows a comparison of the new treatment process with a prior art treatment using an aqueous alkaline solution as disclosed in U.S. Pat. No. 3,361,589. The results indicate only a slight improvement in adhesion (untreated film—1.0 psi) for the aqueous solution (1.25 psi) and a large improvement for the glycol alkaline solution (6.8).

The procedures taught in the above two referenced patents would not be transferable to a process for plating or electroless deposition of metals to plastic substrates. Lamination involves bonding of two films by use of an adhesive. In the '528 patent, the polyimide film is bonded to a copper film using an adhesive to help create the bond. In plating or electroless deposition, the metal is deposited directly on the surface with no intermediate present to improve adhesion.

An object of this invention is to provide an improved process for promoting the adhesion of metal to various engineering thermoplastic substrates without physical modification or degradation of the surface structure. The cohesive integrity of the surface of the substrate is maintained throughout subsequent processing steps. The method provides a means for increasing the adhesion of metallic traces to the surface while maintaining the ability of the surface to be patterned by various techniques.

SUMMARY OF THE INVENTION

The invention to be disclosed describes a pretreatment conditioner for use with various engineering thermoplastic resins prior to electroless deposition of metal. The process constitutes an improvement over prior art methods since a significantly higher degree of adhesion can be achieved using a solvent free, chrome free system with little degradation or deformation of the substrate. More specifically, the invention relates to use of a specific conditioner for polyetherimide thermoplastics prior to oxidizing etchants, which pre-conditions the resin, greatly influencing the way that the etchant attacks the surface. This pre-treatment allows subsequent etching steps to create a maze of submicroscopic cavities or pores on the surface, which can act as interlocking sites for the autocatalytically deposited metal film. The nature of this surface plays a significant role in establishing adhesion without unduly weakening or adversely affecting the physical characteristics of the resin. The specific conditioner, an inorganic hydroxide solution, when used in processing polyetherimide substrates, consistently produces adhesion values in the range of 8–30 lbs./linear inch depending on the grade of the substrate.

Although the specific conditioner of this invention produces high adhesion values on polyetherimide substrates often used in molded interconnect devices, it has been found to be ineffectual in improving adhesion on other molded interconnect substrates such as polyethersulfones.

DESCRIPTION OF THE PREFERRED EMBODIMENTS

The substrate of the present invention may be in a variety of shapes and sizes. The substrate may be produced by various methods including extruding, injection molding, machining or other methods known to the art. The polyimide material useful with this invention may be any of a group of high polymers which have an imide group in the polymer chain. Polyimides are manufactured through a variety of methods with those formed by reacting bis-phenol A dianhydrides with phenylene diamine producing a group referred to as polyetherimides. The preferred polyimides for the present invention are those commonly referred to as "polyetherimides" for example, the General Electric Ultem brand plastic. The polyetherimides may contain various amounts of fillers or reinforcing agents which are well known in the art. These fillers may include glass, silica, mica, mineral glass and others. The amount of fillers present helps to further classify the polyetherimide resins into various grades. The process is also applicable to resins which may contain other components including antistatic agents, pigments, plasticizers, antioxidants and other similar functional additives.

The conditioner used in the pretreatment step prior to etching is a concentrated solution of the inorganic hydroxide. A wetting agent may be added to promote surface contact between the conditioner and the substrate. The use of the inorganic hydroxide solution as a conditioner represents an improvement over prior art conditioners since it provides greater potential for through-put of articles; and is completely aqueous thus eliminating problems associated with drag-out, disposal of spent baths, and ventilation when using organic solutions. The conditioner is more easily waste-treatable than conventional organic solvents. Choice of inorganic hydroxides for preparing the conditioner may be from the group including alkali metal hydroxides, alkaline earth metal hydroxides and ammonium hydroxide. The preferred inorganic hydroxide solution for use with polyetherimide substrates may be an alkali metal hydroxide such as sodium or potassium. The most preferred conditioner is potassium hydroxide. This alkali metal hydroxide was specifically selected because it was found to maximize the resultant metal adhesion strengths.

The addition of a wetting agent to the conditioner promotes uniform conditioning of the surface of the substrate. The wetting agent added to the inorganic hydroxide may be any nonionic glycoside which is soluble in a caustic solution. The most preferred wetting agent is Triton BG-10, manufactured by Rohm and Haas Company. The wetting agent is added at a level of up to 2% but is preferably added at a level of 1%. Additionally, an organic hydroxide material such as a glycol, glycerol or other alcohols may be added with the conditioner and wetting agent. At a level of from about 1% to 20%, the glycol or alcohol serves to increase the effectiveness of the conditioner, shorten treatment times and lower operating temperatures.

The conditioner promotes adhesion without unduly weakening or adversely affecting the physical characteristics of the resin by softening the surface of the resin enough to allow the subsequent etchant to create a microporous surface suitable for initial metallization with minimal degradation of the substrate which insures cohesive integrity of the substrate during functional testing. The degree of softening and depth of chemical attack is controlled for the selected substrate in order to provide optimal adhesion values in the range of 8–30 lbs./linear inch. Control of the amount of softening and the depth of penetration is achieved by selecting the time, temperature and concentration of the hydroxide. The concentration depends on the particular resinous substrate used, and typically ranges from a 20% solution to a saturated solution. However, it is not desirable to use a saturated solution since solid particles tend to precipitate from solution once the conditioning bath cools down. A recommended operating range is 25% to 60% by weight, with the most preferred concentration range being 43% to 48% by weight. The temperature of the solution during immersion of the substrate may range from about 75° C. to about 90° C. The time of immersion again depends on the particular substrate and may range from 1 to 40 minutes, but is preferably 5 to 20 minutes.

The use of the disclosed inorganic hydroxide solution as a conditioner allows for use of a less aggressive etchant than a typical strong etchant such as chromic acid/-sulfuric acid. The preferred etchant for use with the disclosed conditioner is an alkaline permanganate etching solution. A process for permanganate etching is described in U.S. Pat. No. 4,515,829, incorporated herein by reference. The permanganate solution may be either potassium permanganate or sodium permanganate, with the sodium salt being preferred since it allows use of higher concentrations of the permanganate ion in solution. The permanganate solution used is a 0.1 to 1.5 molarity of permanganate solution, depending on the type substrate. The preferred concentration range is 0.3 to 1.0 molarity of permanganate. The permanganate solution is made alkaline with sodium hydroxide to an alkaline normality of about 0.5–1.5N.

Neutralization prior to electroless metal deposition may be accomplished using methods well know to the art, but is preferably carried out using a neutralizer specific for removing manganese residues. The preferred neutralizer is a solution containing 3% of a 35% by weight solution of hydrogen peroxide to which is added 3% sulfuric acid.

While there are many prior art processes for electroless metal deposition, a preferred process comprises the application of copper by a tin-palladium catalysis technique in which the surfaces on which the copper is to be deposited are activated and sensitized in order to catalyze the chemical surface reduction. This process is described in U.S. Pat. No. 3,011,920, incorporated herein by reference.

Following electroless plating, the substrate may be electrolytically plated by conventional means with copper, nickel, gold, silver, solder, chromium and the like to achieve the desired finish or thickness. Alternatively, the full circuit thickness of metal may be achieved using a "full-build" electroless plating solution especially formulated for that purpose such as disclosed in U.S. Pat. No. 4,563,217, incorporated herein by reference. For other applications, an electroless nickel top coat may be preferred as described in U.S. Pat. No. 4,467,067, incorporated herein by reference.

The following specific examples provide novel embodiments of the present invention. They are intended for illustrative purposes only and should not be construed as a limitation upon the broadest aspects of the invention. The examples illustrate various process steps used in operation with the disclosed invention and the results of testing done by IPC Test Method TM-650 to evaluate adhesion, ASTM Method 790 to evaluate flexural modulus, and use of a Dektak IID Surface Profilometer to measure surface roughness.

The following solutions or baths used in the examples should not be taken as limitations to the practice of the invention but as descriptions of representative solutions or baths typically used in the industry.

MLB Promoter 213 is an alkaline sodium permanganate solution used at about 0.8M in permanganate and 1.2N in sodium hydroxide. Neutralizer 218-1 solution is a typical sulfuric/peroxide reducing solution. Cleaner Conditioner 1110A is an acidic catalyst promoter solution. Catalyst Pre-Dip 404 contains hydrochloric acid and sodium chloride. Cataposit 44 is a typical tin-palladium catalyst. Accelerator 241 is an activating solution which contains a sulfonic acid. Cuposit PM 994 is an electroless copper plating solution. Full Build Electrodeposit 1000 solution is an acid copper formulation used for plating.

Solutions were also used from the Copending Application in order to compare results of the new process with the previously disclosed process. Solutions used include Butyrolactone Conditioner (98–100%); Chrome Etch 940 which is a solution of hexavalent chromium, sulfuric acid and water; Neutralizer PM 954 solution which is a typical sulfate reducing solution; Catalyst Pre-Dip 404 containing hydrochloric acid and sodium chloride; Cataposit 44 tin-palladium catalyst; Accelerator 241 activating solution containing sulfonic acid; and Electroless Copper Strike PM 994, an electroless copper plating solution.

EXAMPLE 1

Substrate—General Electric Ultem 2312 (polyetherimide resin/30% glass filler)

| Process Sequence | Immersion Time (min) | Temp °C. |
|---|---|---|
| 1. Hydroxide Conditioner (45% w/w) | 15 | 82 |
| 2. Hot Water Rinse | 5 | 49 |
| 3. MLB Promoter 213 | 30 | 82 |
| 4. Rinse | 5 | R.T. |
| 5. Rinse | 5 | R.T. |
| 6. Neutralizer 218-1 | 5 | R.T. |
| 7. Rinse | 3 | R.T. |
| 8. Cleaner Conditioner 1110A | 5 | R.T. |
| 9. Rinse | 3 | R.T. |
| 10. Catalyst Pre-Dip 404 | 1 | R.T. |
| 11. Cataposit 44 | 5 | 43 |
| 12. Rinse | 2 | R.T. |
| 13. Accelerator 241 | 3 | R.T. |
| 14. Rinse | 3 | R.T. |
| 15. Cuposit PM 994 | 30 | 43 |
| 16. Rinse | 5 | R.T. |
| 17. Set Overnight 12–15 hrs. | | |
| 18. Electroposit 1000, 25 ASF | 45 | R.T. |
| 19. Rinse | 5 | R.T. |
| 20. Bake | 3 hrs. | 121 |

Results: 12.5 lbs./linear inch peel strength

Flexural strength of the resin initially was 22 Kpsi. After the conditioner, promoter and neutralizer steps in the above process, the flexural strength was 22 Kpsi. There was no loss in flexural strength of the resin.

EXAMPLE 2

Substrate—General Electric Ultem 2312 (polyetherimide resin/30% glass filler)

| Process Sequence | Immersion Time (min) | Temp °C. |
|---|---|---|
| 1. Hydroxide Conditioner (45% w/w) | 5–40 | 84 |
| 2. Hot Water Rinse | 3 | 49 |
| 3. MLB Promoter 213 | 30 | 84 |
| 4. Rinse | 3 | R.T. |
| 5. Rinse | 3 | R.T. |
| 6. Neutralizer 218-1 | 5 | R.T. |
| 7. Rinse | 3 | R.T. |
| 8. Cleaner Conditioner 1110A | 5 | R.T. |
| 9. Rinse | 3 | R.T. |
| 10. Catalyst Pre-Dip 404 | 1 | R.T. |
| 11. Cataposit 44 | 5 | 43 |
| 12. Rinse | 3 | R.T. |
| 13. Accelerator 241 | 4 | R.T. |
| 14. Rinse | 2 | R.T. |
| 15. Cuposit PM 994 | 30 | 45 |
| 16. Rinse | 3 | R.T. |
| 17. Set Overnight 12–15 hours | | |
| 18. Electroposit 1000, 25 ASF | 90 | |
| 19. Rinse | 5 | R.T. |
| 20. Bake | '4 hrs. | 121 |

Results of adhesion testing are shown in the following table:

TABLE I

| Time in Conditioner (minutes) | Adhesion (lbs./linear inch) |
|---|---|
| 5 | 9.3 |
| 10 | 10.0 |
| 15 | 11.3 |
| 20 | 16.2 |
| 25 | 11.7 |
| 30 | 12.8 |
| 35 | 13.4 |
| 40 | 13.4 |

EXAMPLE 3

The conditioner was evaluated with and without a nonionic glycoside wetting agent. The wetting agent added to the conditioner was Triton BG-10, added at a level of 1%. This is the most preferred embodiment of the invention.

Substrate—General Electric Ultem 2312 (polyetherimide resin/30% glass filler)

| Process Sequence | Immersion Time (min) | Temp °C. |
|---|---|---|
| 1. Hydroxide Conditioner (45% w/w) + 1% wetting agent | 5-40 | 84 |
| 2. Hot Water Rinse | 3 | 49 |
| 3. MLB Promoter 213 | 30 | 84 |
| 4. Rinse | 3 | R.T. |
| 5. Rinse | 3 | R.T. |
| 6. Neutralizer 218-1 | 5 | R.T. |
| 7. Rinse | 3 | R.T. |
| 8. Cleaner Conditioner 1110A | 5 | R.T. |
| 9. Rinse | 3 | R.T. |
| 10. Catalyst Pre-Dip 404 | 1 | R.T. |
| 11. Cataposit 44 | 5 | 43 |
| 12. Rinse | 3 | R.T. |
| 13. Accelerator 241 | 4 | R.T. |
| 14. Rinse | 2 | R.T. |
| 15. Cuposit PM 994 | 30 | 45 |
| 16. Rinse | 3 | R.T. |
| 17. Set Overnight 12-15 hours | | |
| 18. Electroposit 1000, 25 ASF | 90 | |
| 19. Rinse | 5 | R.T. |
| 20. Bake | 4 hrs. | 121 |

Results of adhesion measurements are shown in the following table:

TABLE II

| Time in Conditioner (minutes) | Adhesion (lbs./linear inch) no additive | additive |
|---|---|---|
| 5 | 9.3 | 10.5 |
| 10 | 10.0 | 18.0 |
| 15 | 11.3 | 16.2 |
| 20 | 16.2 | 12.2 |
| 25 | 11.7 | 13.0 |
| 30 | 12.8 | 13.4 |
| 35 | 13.4 | 14.4 |
| 40 | 13.4 | 17.6 |

EXAMPLE 4

In order to evaluate changes in flexural strength using prior art pretreatment processes, the following process steps from the Copending Application were used:

Substrate—General Electric Ultem 2312 (polyetherimide resin/30% glass filler)

| Process Sequence | Immersion Time (min) | Temp. °C. |
|---|---|---|
| 1. Butyrolactone (98-100%) | 6 | 49 |
| 2. Hot Water Rinse | 5 | 49 |
| 3. Chrome Etch PM 940 | 6 | 71 |
| 4. Rinse | 5 | R.T. |
| 5. Neutralizer PM 954 | 6 | 65 |
| 6. Rinse | 5 | R.T. |

The initial flexural strength was 22 Kpsi. After the above treatment process, the flexural strength was 18 Kpsi, a loss of in flexural strength. In Example 1 it was shown that use of the conditioner of the present invention caused no loss in flexural strength.

EXAMPLE 5

Performance of the inorganic hydroxide conditioner was also evaluated using a chromic acid/sulfuric acid etchant after treatment with the conditioner.

Substrate—General Electric Ultem 2312 (polyetherimide resin/30% glass filler)

| Process Sequence | Immersion Time (min) | Temp °C. |
|---|---|---|
| 1. Hydroxide Conditioner (45% w/w) + 1% wetting agent | 10 | 84 |
| 2. Hot Water Rinse | 3 | 49 |
| 3. Chrome Etch PM 940 | 5 | 71 |
| 4. Rinse | 5 | R.T. |
| 5. Rinse | 5 | R.T. |
| 6. Rinse | 5 | R.T. |
| 7. Neutralizer PM 954 | 6 | 65 |
| 8. Rinse | 5 | R.T. |
| 9. Catalyst Pre-Dip 404 | 1 | R.T. |
| 10. Cataposit 44 | 6 | 43 |
| 11. Rinse | 3 | R.T. |
| 12. Accelerator 241 | 2 | R.T. |
| 13. Rinse | 3 | R.T. |
| 14. Electroless Copper Strike PM 994 | 15 | 43 |

Visual examination of the substrate after electroless deposition of copper showed blistering of the copper layer, indicating poor adhesion. No further processing of the substrate was possible.

EXAMPLE 6

Measurement of changes in surface roughness of the substrate attributable to the conditioner of the Copending Application was determined after the following treatment steps:

Substrate—General Electric Ultem 2200 (polyetherimide resin/20% glass filler)

| Process Sequence | Immersion Time (min.) | Temp. °C. |
|---|---|---|
| 1. Butyrolactone (98-100%) | 3 | 49 |
| 2. Hot Water Rinse | 5 | 49 |
| 3. Chrome Etch PM 940 | 5 | 71 |
| 4. Rinse | 5 | R.T. |
| 5. Neutralizer PM 954 | 6 | 65 |
| 6. Rinse | 5 | R.T. |

The initial surface roughness was 15 microinches. Surface roughness after the above pretreatment was 30 microinches. After complete processing of the substrate, using the additional steps 8 through 14 in Example 5 and steps 16 through 20 in Example 3, adhesion of the deposited copper was 5 lbs./linear inch.

EXAMPLE 7

Comparison of the above results with changes in surface roughness attributable to the disclosed conditioner of the present invention was made. The substrate was treated as follows:

Substrate—General Electric Ultem 2200 (polyetherimide resin/20% glass filler)

| Process Sequence | Immersion Time (min) | Temp °C. |
|---|---|---|
| 1. Hydroxide Conditioner (45% w/w) + 1% wetting agent | 10 | 84 |

-continued

| Process Sequence | Immersion Time (min) | Temp °C. |
|---|---|---|
| 2. Hot Water Rinse | 3 | 49 |
| 3. MLB Promoter 213 | 30 | 84 |
| 4. Rinse | 3 | R.T. |
| 5. Rinse | 3 | R.T. |
| 6. Neutralizer 218-1 | 5 | R.T. |
| 7. Rinse | 3 | R.T. |

The initial surface roughness was 10 microinches. Surface roughness after treatment was 10 microinches, showing no change in surface roughness. Processing of the substrate was completed using steps 8 through 20 in Example 3. Adhesion of the copper to the substrate was 15 lbs./linear inch.

EXAMPLE 8

Polyethersulfone is a plastic substrate often substituted for polyetherimides in molded board fabrication. In order to test transferability of this conditioner to that substrate, the following test was run with visual evaluations of the substrate after each process step.

Substrate—ICI Victrex TM GL20 Resin (Polyethersulfone resin/20% glass filler)

| Process Sequence | Immersion Time (min) | Temp °C. |
|---|---|---|
| 1. Hydroxide Conditioner (45% w/w) + 1% wetting agent | 10 | 84 |
| 2. Hot Water Rinse | 3 | 49 |
| 3. MLB Promoter 213 | 30 | 84 |
| 4. Rinse | 3 | R.T. |
| 5. Rinse | 3 | R.T. |
| 6. Neutralizer 218-1 | 5 | R.T. |
| 7. Rinse | 3 | R.T. |
| 8. Cleaner Conditioner 1110A | 5 | R.T. |
| 9. Rinse | 3 | R.T. |
| 10. Catalyst Pre-Dip 404 | 1 | R.T. |
| 11. Cataposit 44 | 5 | 43 |
| 12. Rinse | 3 | R.T. |
| 13. Accelerator 241 | 4 | R.T. |
| 14. Rinse | 2 | R.T. |
| 15. Cuposit PM 994 | 30 | 45 |
| 16. Rinse | 3 | R.T. |

After step 16, it was noted that the electrodeposited copper layer blistered, indicating very poor adhesion. No further processing of the substrate was possible.

EXAMPLE 9

The preferred process of this invention, as disclosed in Example 3, was used to compare adhesion results for various grades of Ultem TM substrates and are presented in the following table:

TABLE III

| Substrate Grade | Adhesion (lbs./linear inch) |
|---|---|
| 2200 (20% glass filler) | 15.0 |
| 2312 (30% glass filler) | 18.0 |
| 3452 (45% glass & mica filled) | 8.5 |
| 7205 (nickel plated graphite) | 11.0 |

What is claimed is:

1. A process for metal plating a polyetherimide substrate, said process comprising the steps of conditioning said substrate by contact with an inorganic hydroxide solution, etching the substrate with an alkaline permanganate solution, catalyzing the substrate with an electroless plating catalyst and metal plating said catalyzed polyetherimide substrate, said step of conditioning said substrate preceding said step of etching the substrate.

2. The process of claim 1 wherein said inorganic hydroxide is chosen from the group comprising alkali metal hydroxides, alkaline earth metal hydroxides and ammonium hydroxide.

3. The process of claim 1 wherein said inorganic hydroxide is an alkali metal hydroxide.

4. The process of claim 1 wherein said inorganic hydroxide is potassium hydroxide.

5. The process of claim 1 wherein said alkali metal hydroxide is sodium hydroxide.

6. The process of claim 1 wherein said inorganic hydroxide is present in a concentration of 25% to 60%.

7. The process of claim 1 wherein said inorganic hydroxide in a concentration of 43% to 48%

8. The process of claim 1 wherein the temperature of said inorganic hydroxide solution is in the range of 75° C. to 90° C.

9. The process of claim 1 wherein the temperature of said inorganic hydroxide is 80° C. to 85° C.

10. The process of claim 1 wherein contact time of said substrate in said hydroxide solution is for 1 to 40 minutes.

11. The process of claim 1 wherein contact time of said substrate in said inorganic hydroxide solution is for 5 to 20 minutes.

12. The process of claim 1 wherein said metal is copper, nickel or a combination thereof.

13. The process of claim 1 wherein said inorganic hydroxide solution contains a nonionic glycoside in an amount of less than 2%.

14. The process of claim 1 wherein said inorganic hydroxide solution contains a glycol.

15. The process of claim 14 wherein said glycol is present in an amount less than 20%.

16. The process of claim 14 wherein said glycol is ethylene glycol.

17. The process of claim 14 wherein said glycol is glycerol.

* * * * *